(12) United States Patent
Hwang et al.

(10) Patent No.: US 8,177,862 B2
(45) Date of Patent: May 15, 2012

(54) THERMAL COMPRESSIVE BOND HEAD

(75) Inventors: Chien Ling Hwang, Hsin-Chu (TW);
Cheng-Chung Lin, Taipei (TW);
Ying-Jui Huang, Taipei (TW);
Chung-Shi Liu, Shin-Chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 12/901,273

(22) Filed: Oct. 8, 2010

(65) Prior Publication Data
US 2012/0088362 A1 Apr. 12, 2012

(51) Int. Cl.
*H01L 21/58* (2006.01)

(52) U.S. Cl. ....... 29/25.01; 438/108; 438/119; 438/615; 438/661

(58) Field of Classification Search ........... 438/108, 438/119, 615, 661; 29/25.01, 46, 51; 257/E21.511
See application file for complete search history.

(56) References Cited

U.S. PATENT DOCUMENTS

| | | |
|---|---|---|
| 4,865,245 A | 9/1989 | Schulte et al. |
| 4,878,611 A | 11/1989 | LoVasco et al. |
| 5,113,581 A * | 5/1992 | Hidese ............................ 29/840 |
| 5,148,968 A | 9/1992 | Schmidt et al. |
| 5,244,142 A | 9/1993 | Nishiguchi et al. |
| 5,346,857 A | 9/1994 | Scharr et al. |
| 5,385,291 A | 1/1995 | Latta |
| 5,439,161 A | 8/1995 | Kawatani et al. |
| 5,441,195 A | 8/1995 | Tustaniwskyj et al. |
| 5,611,481 A | 3/1997 | Akamatsu et al. |
| 5,632,434 A | 5/1997 | Evans et al. |
| 5,639,696 A | 6/1997 | Liang et al. |
| 5,698,068 A | 12/1997 | Ichikawa et al. |
| 5,745,986 A | 5/1998 | Variot et al. |
| 5,964,396 A | 10/1999 | Brofman et al. |
| 5,968,670 A | 10/1999 | Brofman et al. |
| 5,975,409 A | 11/1999 | Brofman et al. |
| 5,984,165 A | 11/1999 | Inoue et al. |
| 6,131,795 A | 10/2000 | Sato |
| 6,279,815 B1 | 8/2001 | Correia et al. |
| 6,550,665 B1 | 4/2003 | Parrish et al. |
| 6,796,481 B2 | 9/2004 | Yamauchi |
| 6,890,795 B1 | 5/2005 | Wong et al. |
| 7,165,711 B2 | 1/2007 | Barretto et al. |
| 7,235,886 B1 | 6/2007 | Chandran et al. |
| 7,257,887 B2 | 8/2007 | Lee |
| 7,287,685 B2 | 10/2007 | Farooq et al. |

(Continued)

FOREIGN PATENT DOCUMENTS

JP 2-206138 A 8/1990
(Continued)

OTHER PUBLICATIONS

"Process for Elongating Semiconductor Device Solder Connections," TDB-ACC-No. NN84081579; IBM Technical Disclosure Bulletin, vol. 27, No. 3, Aug. 1, 1984, 2 pgs.

*Primary Examiner* — George Fourson, III
(74) *Attorney, Agent, or Firm* — Slater & Matsil, L.L.P.

(57) ABSTRACT

A method includes allowing a work piece having a solder bump to contact a bond head; heating the bond head until the solder bump is melted; and conducting a cooling media into the bond head to cool the solder bump and to solidify the solder bump.

15 Claims, 6 Drawing Sheets

U.S. PATENT DOCUMENTS

| | | |
|---|---|---|
| 7,299,965 B2 | 11/2007 | Sato |
| 7,455,213 B2 | 11/2008 | Nishiyama |
| 7,569,939 B2 | 8/2009 | Khandekar et al. |
| 7,699,210 B2 | 4/2010 | Suh |
| 7,731,077 B2 | 6/2010 | Farooq et al. |
| 2002/0056740 A1* | 5/2002 | Hayashi .................... 228/110.1 |
| 2002/0109000 A1 | 8/2002 | Rinne |
| 2002/0140094 A1 | 10/2002 | Kubota et al. |
| 2005/0035182 A1 | 2/2005 | Mano et al. |
| 2005/0061856 A1 | 3/2005 | Maki et al. |
| 2006/0244128 A1* | 11/2006 | Hayashi et al. ............... 257/712 |
| 2007/0000592 A1 | 1/2007 | Fares et al. |
| 2007/0099412 A1 | 5/2007 | Miyazaki |
| 2007/0108594 A1 | 5/2007 | Ishii |
| 2007/0287262 A1 | 12/2007 | Maki et al. |
| 2008/0035274 A1 | 2/2008 | Kanisawa |
| 2008/0158843 A1 | 7/2008 | So et al. |
| 2008/0171404 A1* | 7/2008 | Zakel et al. ................... 438/109 |
| 2009/0008800 A1 | 1/2009 | Nakatani et al. |
| 2009/0091025 A1 | 4/2009 | Wong et al. |
| 2009/0125141 A1 | 5/2009 | Noda et al. |
| 2009/0126188 A1 | 5/2009 | Sakai et al. |
| 2009/0127315 A1* | 5/2009 | Okita ............................ 228/102 |
| 2009/0229853 A1 | 9/2009 | Fukuda |
| 2010/0288416 A1 | 11/2010 | Hamazaki |

FOREIGN PATENT DOCUMENTS

| | | | |
|---|---|---|---|
| JP | 10-223693 A | | 8/1998 |
| JP | 2002-26494 A | | 1/2002 |
| JP | 2003303856 A | * | 10/2003 |
| JP | 5-190601 A | | 7/2005 |

* cited by examiner

THERMAL COMPRESSIVE BOND HEAD

CROSS-REFERENCES TO RELATED APPLICATIONS

This application relates to the following commonly-assigned U.S. patent applications: application Ser. No. 12/841,858, filed Jul. 22, 2010, entitled "Thermal Compress Bonding," and application Ser. No. 12/874,009, filed Sep. 1, 2010, entitled "Thermal Compressive Bonding with Separate Die-Attach and Reflow Processes," which applications are hereby incorporated herein by reference.

BACKGROUND

Integrated circuits are formed on semiconductor wafers, which are then sawed into semiconductor chips. The semiconductor chips may be bonded onto package substrates. During the bonding process, the solder bumps between the semiconductor chips and the package substrates are reflowed. Conventional reflow methods include convection-type reflow and thermal compressive reflow. The convection-type reflow has relatively high throughput since multiple package substrates and the overlying dies may be bonded through the reflow at the same time. However, the convection-type reflow requires a long period of time to heat solder bumps. The resulting high thermal budget may cause significant warpage in the dies, and may possibly cause delamination between low-k dielectric layers in the dies.

The thermal compressive reflow requires a lower thermal budget than the convection-type reflow. In conventional thermal compressive bonding processes, a die is stacked on a package substrate, with the solder bumps on a surface of the die being pressed against the solder bumps on the surface of the package substrate. The bond head of the thermal compressive bonding apparatus then heats the die until the solder bumps melt. After the melting of the solder bumps, solder bumps cool down to solidify. Cooling air may be blown to the bond head, the solder bumps, and the package substrate to speed up the cooling.

In the conventional bump cooling process, depending on the direction of the cooling air, solder bumps solidify at different time. The non-uniformity in the solidification of the solder bumps results in stress to be generated by the solder bumps. For example, the solder bumps that solidify later than other solder bumps may pull surrounding parts of dielectric layers in the die. In addition, the conventional air cooling has a low efficiency.

Additional conventional bump cooling processes further include water cooling, which includes attaching a water cooling apparatus to the bond head, wherein water may flow in the cooling apparatus. The cooling apparatus encircles an upper part of the bond head, which is further attached to a lower part of the bond head. The lower part of the bond head has a dimension greater than a size of the die, and is used to contact the die. The upper part, on the other hand, has a smaller size than the die. Accordingly, during the bump cooling process, the heat coming from the solder bumps and the die is transferred to the cooling apparatus through the lower part and the upper part of the bond head. This cooling method also causes non-uniformity in the cooling of solder bumps.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel cooling method and the respective apparatus for a thermal compressive bonding (TCB), sometimes known as thermal compression bonding, is provided. Variations of the embodiments are also illustrated. Throughout the various views and illustrative embodiments, like reference numbers are used to designate like elements.

Figure 1A:
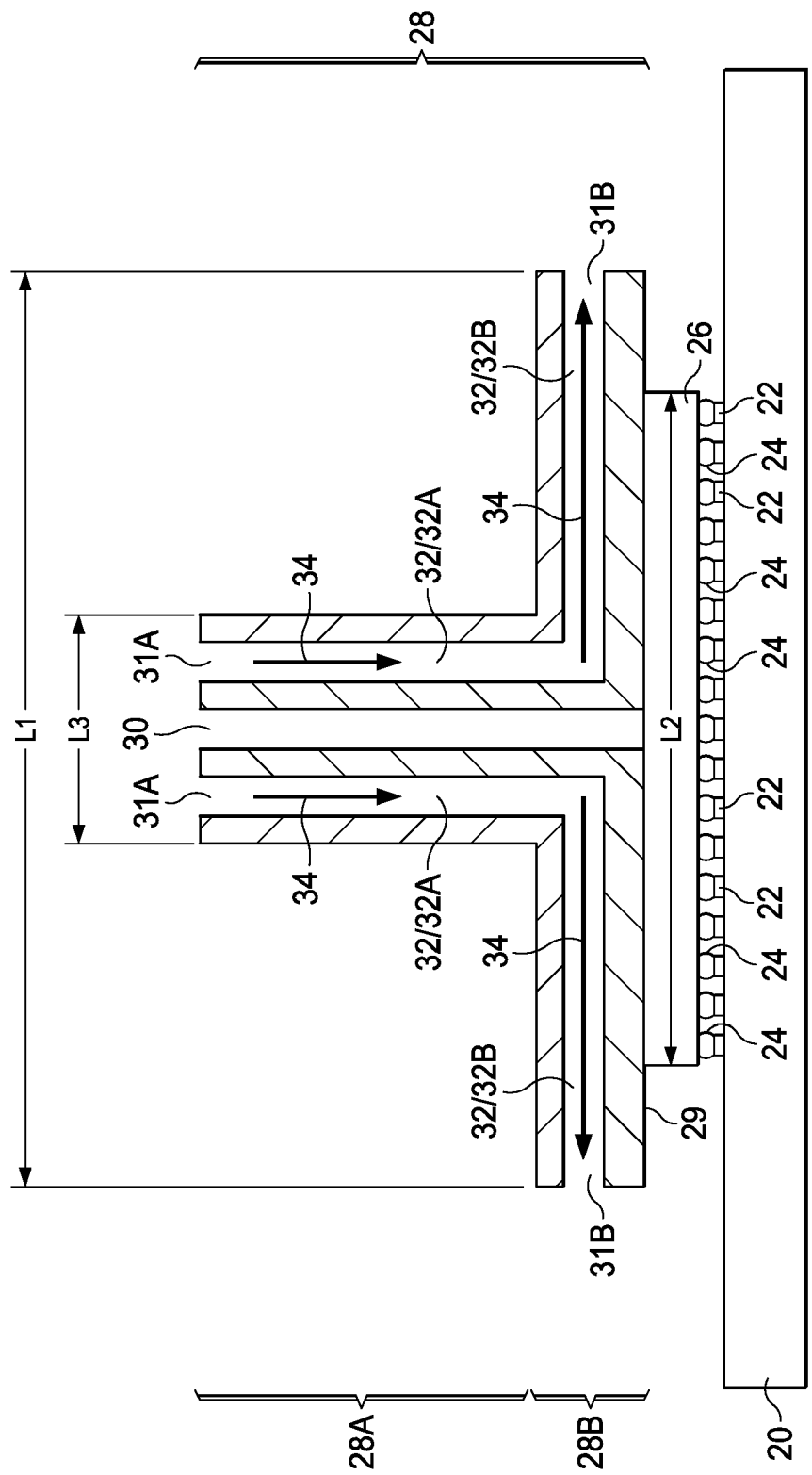
FIG. 1A illustrates a cross-sectional view of a thermal compressive bonding (TCB) process using a thermal compressive bonding (TCB) bond head, which includes a cooling-media channel therein.

FIG. 1A illustrates a cross-sectional view of a TCB bonding process. Work piece 26 is placed on work piece 20. Metal bumps 22 on the surface of work piece 20 are in contact with metal bumps 24 at the surface of work piece 26. One of both of work pieces 20 and 26 may be a device die (chip) comprising active devices (not shown), which may be transistors. Alternatively, one or both of work pieces 20 and 26 may be an interposer, a package substrate, or the like. In an embodiment, metal bumps 22 and 24 are solder bumps, although they can be other type of bumps such as copper bumps. However, at least one, and may be both, of metal bumps 22 and 24 are solder bumps. In the following illustrated exemplary embodiments, metal bumps 22 and 24 are all solder bumps.

TCB bond head 28, which is a part of a bonding apparatus, is used to pick up and place work piece 26 over work piece 20. TCB bond head 28 includes upper part 28A and lower part 28B. The material of bond head 28 may include metals, ceramics, and/or the like. In an embodiment, bond head 28 comprises parts formed of aluminum nitride. Upper part 28A may have the shape of a pipe. Lower part 28B has horizontal size L1 greater than the horizontal size L2 of work piece 26. The horizontal size L3 of upper part 28A may be smaller than horizontal size L1, and may be equal to or greater than horizontal size L2. TCB bond head 28 includes vacuum channel 30 therein, which may be located along a central axis of TCB bond head 28. Vacuum channel 30 is used to create a vacuum environment therein, so that TCB bond head 28 may be used to pick up work piece 26, and to place work piece 26 on work piece 20. After the placement of work piece 26, TCB bond head remains contacting work piece 26, and may apply a downward force on work piece 26, so that metal bumps 22 and 24 are pressed against each other to prevent work piece 26 from slipping.

Cooling-media channel 32 is formed in TCB bond head 28, and extends from upper part 28A into lower part 28B. In an embodiment, cooling-media channel 32 is used to conduct cooling air, and hence is alternatively referred to as cooling-air channel 32. Cooling-air channel 32 has inlet 31A, from which the cooling air enters into cooling-air channel 32, and outlet(s) 31B, from which the cooling-air exits cooling-air channel 32. Cooling-air channel 32 includes portion 32A in upper part 28A of bond head 28, wherein portion 32A may extend in a vertical direction perpendicular to the flat bottom surface 29 of TCB bond head 28. Further, cooling-air channel 32 includes portion 32B in lower part 28B of bond head 28, wherein portion 32B may extend in a horizontal direction parallel to the bottom surface 29 of TCB bond head 28.

In an embodiment, after TCB bond head 28 picks up work piece 26 and places work piece 26 on work piece 20, TCB bond head 28 heats work piece 26, and the heat is conducted to, and causes the reflow of, solder bumps 22 and 24. In an embodiment, TCB bond head 28 includes coils (not shown) that heats up when an electrical current(s) flows through. During the melting of solder bumps 22 and 24, TCB bond head 28 (and work piece 26) may be maintained at a fixed level to prevent the melted bumps 22 and 24 from collapsing, which may in turn cause neighboring bumps 22 and or 24 to short to each other. After the reflow to form solder bumps 22/24, which is the resulting solder bumps with the melted solder bumps 22 and 24 joining together, TCB bond head 28 applies an upward force (sucks up) on work piece 26 by using vacuum, so that the height of solder bumps 22/24 is increased, and horizontal sizes of solder bumps 22/24 are reduced.

During the heating of TCB bond head 28, no cooling air is introduced into cooling-air channel 32. After metal bumps 22/24 melt, the heating of TCB bond head 28 stops, and solder bumps 22/24 start to solidify. Cooling air is then introduced into cooling-air channel 32 by entering into cooling-air channel 32 from inlet 31A, and existing out of outlet 31B. In an embodiment, the cooling air, which is symbolized using arrows 34, is at the room temperature (for example, at about 21° C.). In alternative embodiments, cooling air 34 is at a temperature lower than the room temperature, for example, at about 15° C. or even lower. The flowing of cooling air 34 speeds up the cooling of TCB bond head 28, the cooling of work piece 26, and the cooling of metal bumps 22/24. Further, since cooling air 34 flows through both the center portion and the edge portions of TCB bond head 28, the uniformity in the temperatures of the center and edge portions of TCB bond head 28 is improved. Accordingly, the cooling of different portions (such as the center portion and edge portions) of work piece 26 is improved, and the uniformity in the solidification of different metal bumps 22/24 is improved.

Figure 1B:
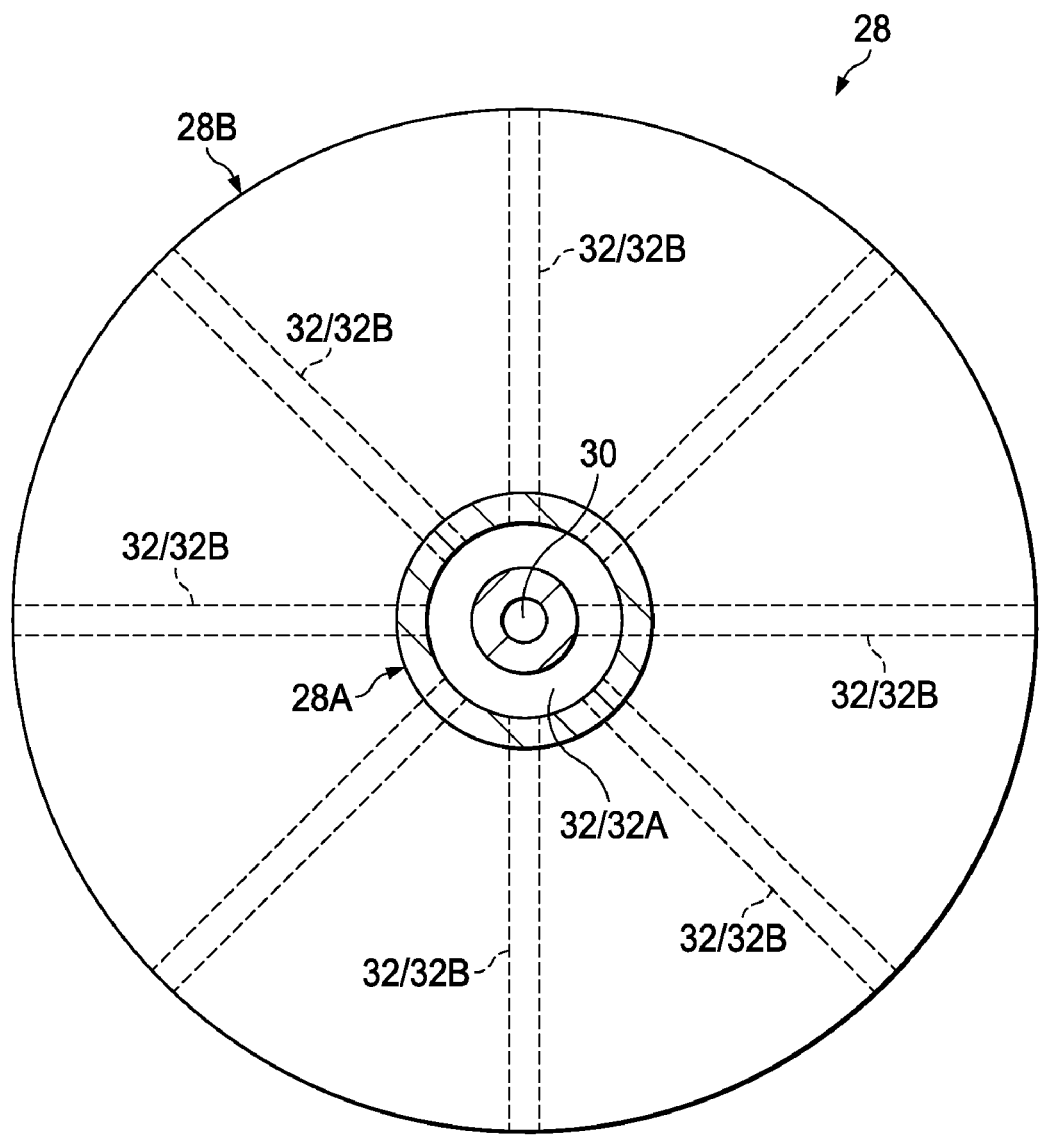
FIGS. 1B and 1C are top views of TCB bond heads in accordance with various embodiments.
Figure 1C:
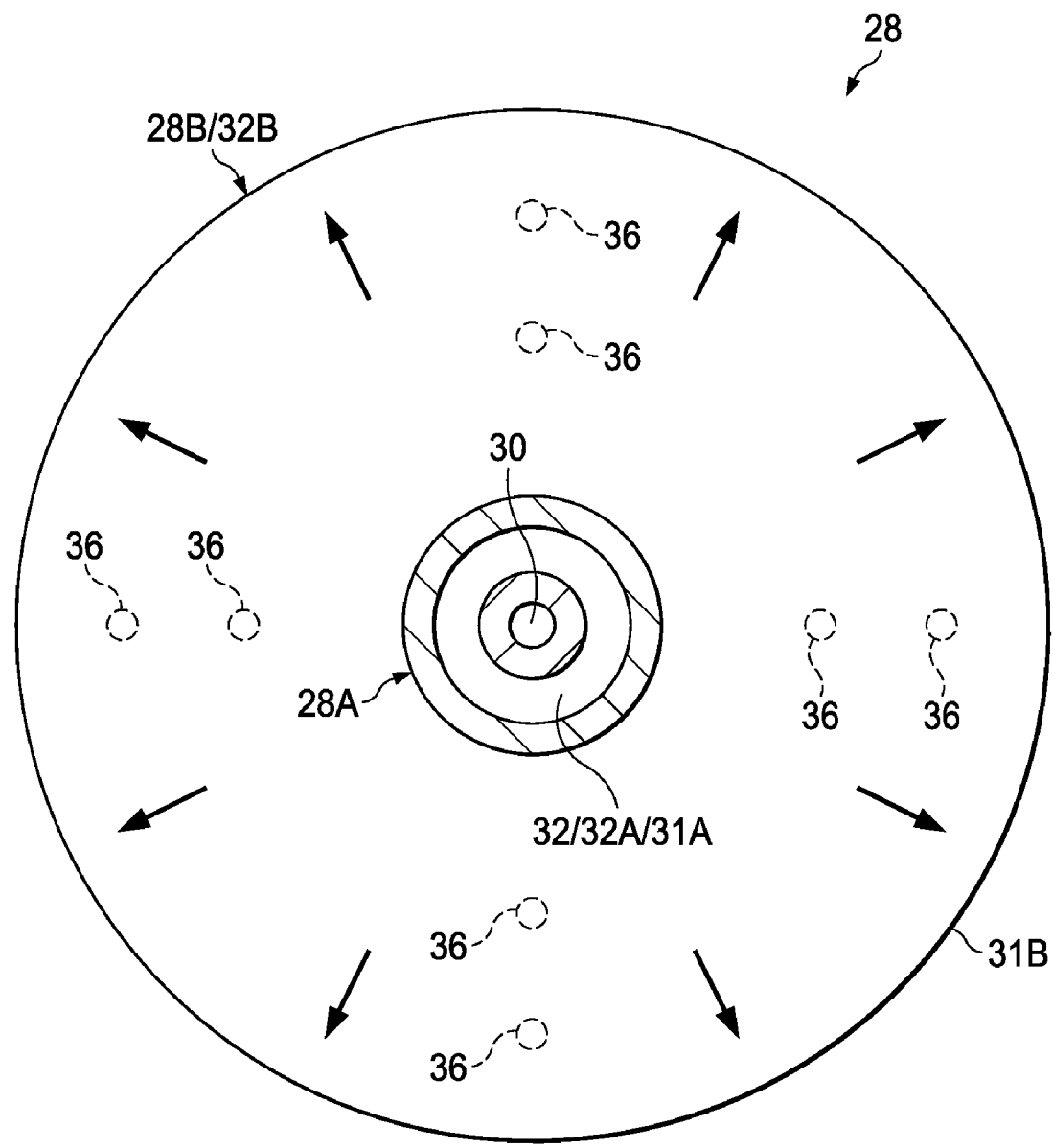

FIGS. 1B and 1C illustrate the top views of TCB bond head 28. The portion 32A of cooling-air channel 32, which is in upper part 28A of TCB bond head 28, may have a circular shape encircling channel 32. Bond head 28, although illustrated as having a circular top-view shape in FIGS. 1B and 1C, may also have a rectangular top-view shape. FIG. 1B illustrates an embodiment in which a plurality of cooling-air channels 32B are distributed in lower part 28B in a radiation pattern, with the plurality of cooling-air channel portions 32B connected to portion 32A and radiating toward the outer edge(s) of lower part 28B. In alternative embodiments, as shown in FIG. 1C, channel portion 32B forms a single channel vertically overlapping substantially all of lower part 28B. Discrete rods 36 are disposed in channel portion 32B in order to hold together a first piece of TCB bond head 28 over (when viewed in a cross-sectional view) the cooling-air channel 32 and a second piece of TCB bond head 28 underlying cooling-air channel 32. Accordingly, the cooling air may flow through lower part 28B in a pattern as illustrated by arrows. In this embodiment, inlet 31A is also at a top edge of bond head 28, while outlet 31B extends through all of the edges of lower part 28B.

Figure 2A:
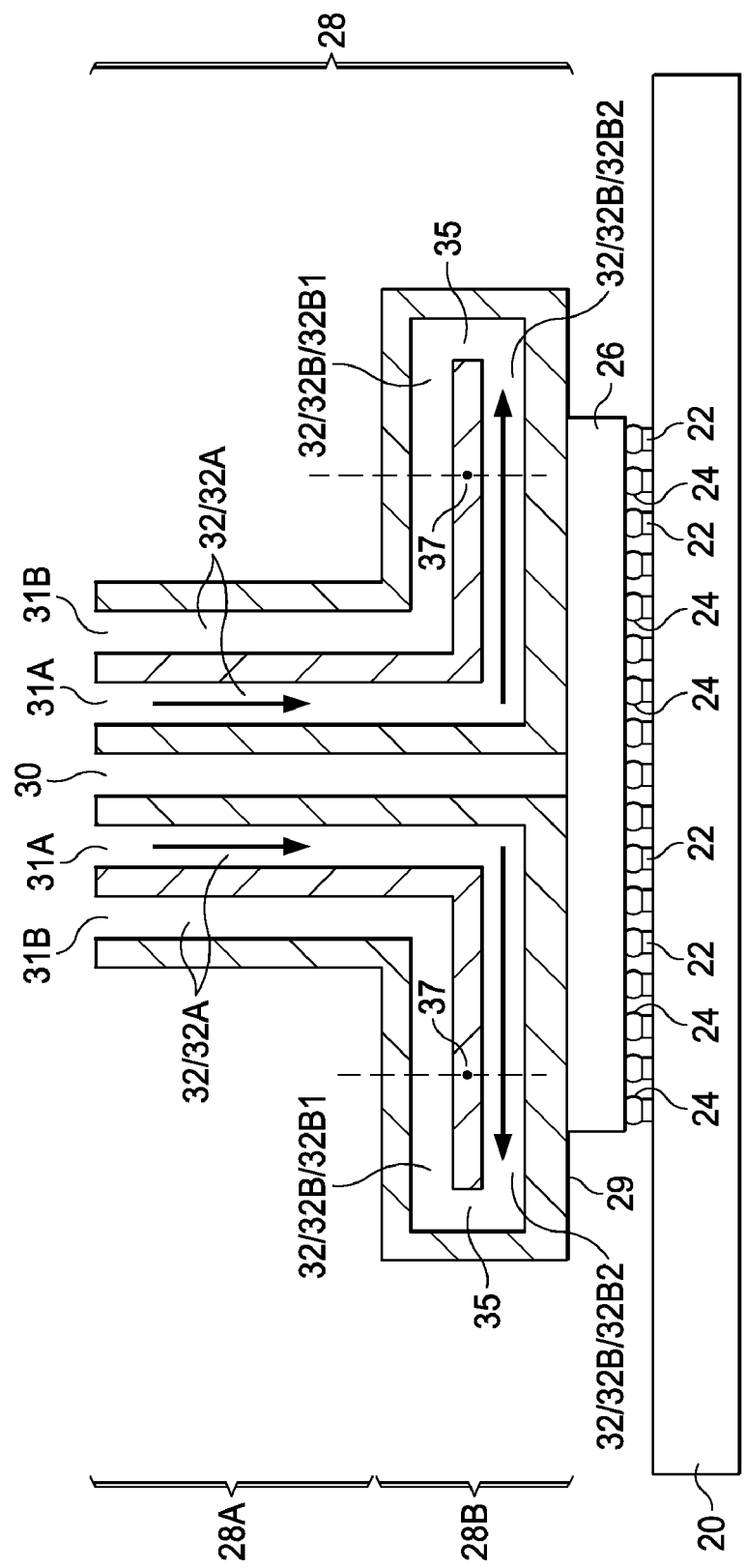
FIGS. 2A and 2B are a top view and a cross-sectional view of a TCB bond head, wherein an inlet and an outlet of a cooling-media channel are located at a top end of the TCB bond head.
Figure 2B:
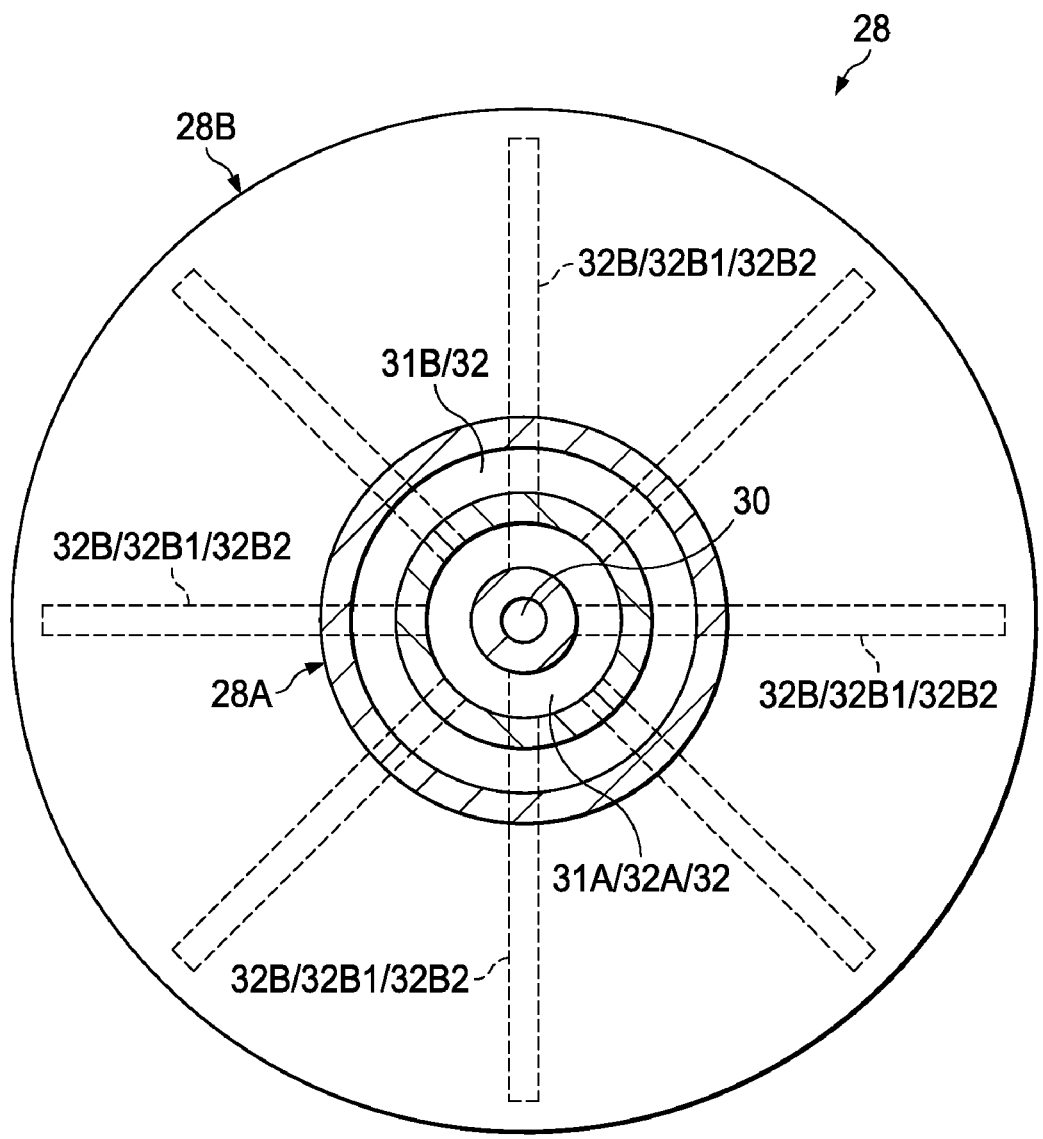

FIGS. 2A and 2B illustrate a cross-section view and a top view, respectively, of TCB bond head 28 in accordance with an alternative embodiment. Referring to FIG. 2A, instead of having outlet 31B at the edge of lower part 28B, outlet 31B is located at a top end of upper part 28A, and no outlet is located at the edge of lower part 28B. Accordingly, cooling-air channel 32 enters into the upper part 28A, and is routed through lower part 28B, and back to upper part 28A. The returning points 35 of cooling-air channel 32 may be close to the outer edge of lower part 28B, although it may be away from the edge, such as at the middle points 37 between channel 30 and the edges of lower part 28B. Portion of cooling-air channel 32B includes incoming path 32B2 and returning path 32B1, which may vertically overlap each other (as shown in FIG. 2A) or may be located at a same level in lower bond head part 28B. FIG. 2B illustrates an exemplary top view of the TCB bond head 28 as shown in FIG. 2A. In the illustrated embodiment, incoming path 32B2 and returning path 32B1 are shown as vertically overlapping each other. It is realized that cooling-air channel 32 may be allocated in different patterns.

Figure 3:
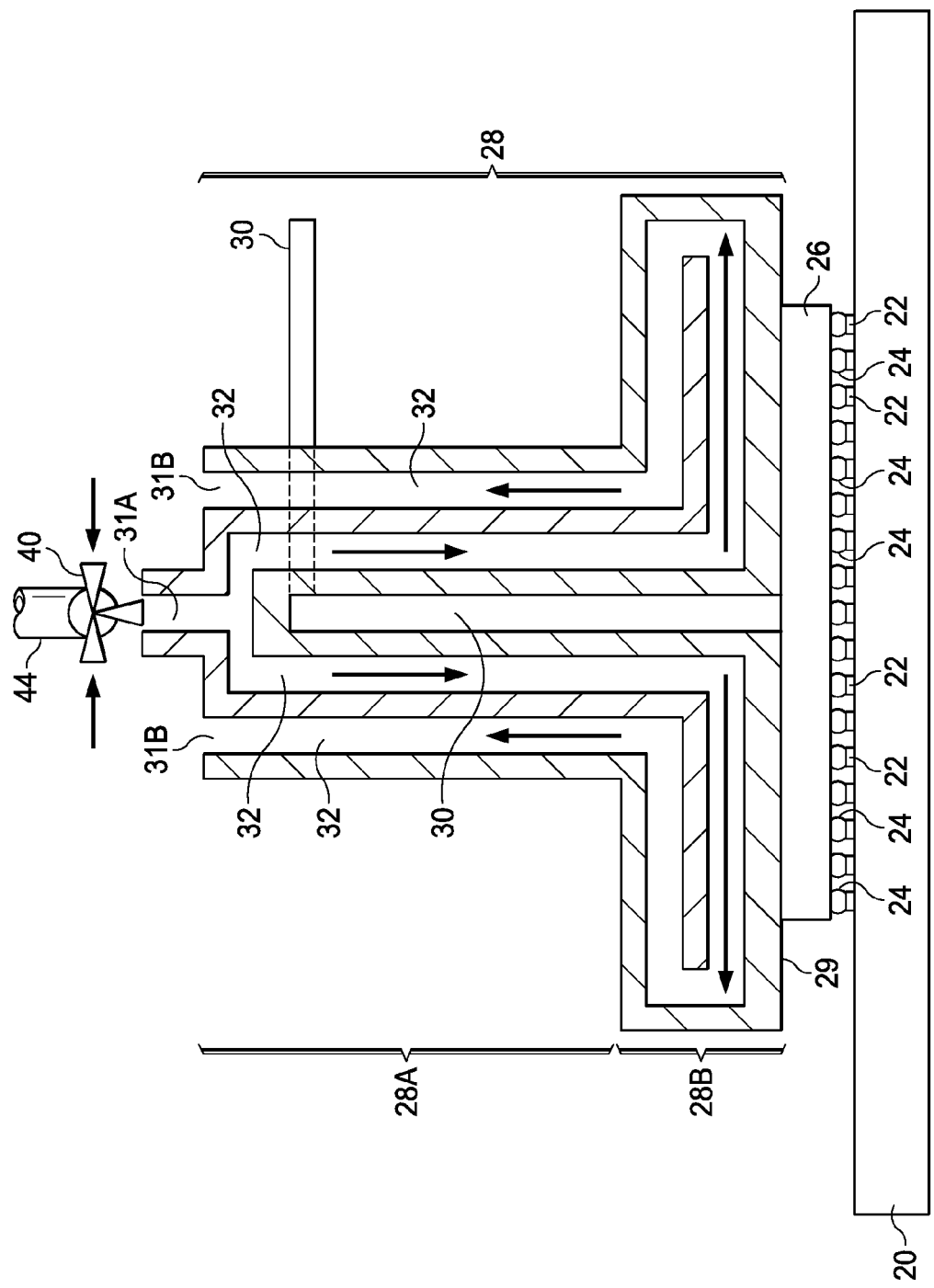
FIG. 3 illustrates a TCB bond head in accordance with an alternative embodiment, wherein a valve is connected to an inlet of a cooling-media channel.

FIG. 3 illustrates TCB bond head 28 in accordance with yet another embodiment, wherein valve 40 is attached to inlet 31A of cooling-media channel 32. In these embodiments, the cooling media that is used for the cooling may be air, water (such as de-ionized water), oil, or the like. Valve 40 is used control the in-flow of the cooling media. In the embodiments wherein water is used as the cooling media, after the cooling is finished for the bonding of two work pieces, clean air may be used to purge water/moisture out of cooling-media channel 32 to prevent the remaining water/moisture from adversely affecting the control of the temperature of TCB bond head 28 in the subsequent heating of TCB bond head 28. After the purging of water/moisture, valve 40 may be turned off, so that water may enter pipe 44, but not into cooling-media channel 32. Valve 40 will be used to prevent water from entering cooling-media channel 32 during the heating of TCB bond pad 28. After the reflow of metal bumps 22/24, the cooling process is started, and valve 40 is opened to allow water to enter into cooling-media channel 32. After the cooling process, cooling-media channel 32 is purged again.

In the embodiments, by introducing the cooling-media into TCB bond head 28 (FIGS. 1A through 3) during the cooling process of the TCB, the heat in solder bumps 22/24 and work piece 26 is conducted vertically through TCB bond head 28. As a result, the cooling of solder bumps 22/24 is more uniform. Further, with the heat being conducted away more efficiently, a greater cooling rate and a higher throughput may be achieved for the TCB.

In accordance with embodiments, a method includes allowing a work piece having a solder bump to contact a bond head; heating the bond head until the solder bump is melted; and conducting a cooling media into the bond head to cool the solder bump and to solidify the solder bump.

In accordance with other embodiments, a method includes attaching a first work piece onto a second work piece, with a solder bump between the first and the second work pieces; heating the first work piece using a bond head to melt the solder bump; and after the step of heating the first work piece, conducting a cooling media into and out of a cooling-medial channel inside the bond head to solidify the solder bump.

In accordance with yet other embodiments, a bonding apparatus includes a bond head comprising a flat bottom surface; a vacuum channel in the bond head and comprising an opening at the flat bottom surface; and a cooling-media channel in the bond head. The cooling-media channel includes an inlet at a top end of the bond head, and an outlet not located at the flat bottom surface.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   allowing a work piece comprising a solder bump to contact a bond head;
   heating the bond head until the solder bump is melted;
   conducting water into a cooling-media channel of the bond head to cool the solder bump and to solidify the solder bump; and
   after the step of conducting water into the cooling-media channel, purging the cooling-media channel with air.

2. The method of claim 1, wherein the cooling-media channel comprises an inlet and an outlet, and wherein the water enters into the inlet and exits the outlet.

3. The method of claim 1, wherein the water is conducted into the cooling-media channel from a top end of the bond head, and is conducted out of the bond head from an edge of the bond head.

4. The method of claim 1, wherein the water is conducted into and out of the cooling-media channel from a top end of the bond head.

5. A method comprising:
   attaching a first work piece onto a second work piece, with a solder bump between the first and the second work pieces;
   heating the first work piece using a bond head to melt the solder bump;
   after the step of heating the first work piece, conducting a cooling media into and out of a cooling-medial channel inside the bond head to solidify the solder bump; and
   after the step of heating the first work piece and before the step of conducting the cooling media, lifting up the bond head to extend a length of the solder bump in a vertical direction.

6. The method of claim 5, wherein the step of conducting the cooling media comprises conducting air.

7. The method of claim 5, wherein the step of conducting the cooling media comprises conducting water.

8. The method of claim 7 further comprising, after the step of water into the cooling-media channel, purging the cooling-media channel with air.

9. The method of claim 5, wherein the bond head comprises an upper portion having a first horizontal size, and a lower portion having a second horizontal size greater than the first horizontal size, with the lower portion contacting the first work piece, and wherein the cooling media is conducted in the upper portion in a vertical direction perpendicular to a bottom surface of the bond head, and in the lower portion in a horizontal direction parallel to the bottom surface of the bond head.

10. The method of claim 5, wherein the cooling media is conducted into the cooling-media channel from a top end of the bond head, and is conducted out of the bond head from an edge of the bond head.

11. The method of claim 5, wherein the cooling media is conducted into and out of the cooling-media channel from a top end of the bond head.

12. A bonding apparatus comprising:
   a bond head comprising a flat bottom surface;
   a vacuum channel in the bond head and comprising an opening at the flat bottom surface;
   a cooling-media channel in the bond head, wherein the cooling-media channel comprises an inlet at a top end of the bond head, and an outlet not located at the flat bottom surface, and wherein the cooling-media channel vertically overlaps substantially an entirety of the flat bottom surface; and
   a plurality of rods interconnecting a first portion of the bond head over the cooling-media channel and a second portion of the bond head underlying the cooling-media channel.

13. The bonding apparatus of claim 12, wherein the outlet of the cooling-media channel is at an edge of the bond head.

14. The bonding apparatus of claim 13, wherein the cooling-media channel comprises a plurality of outlets on edges of the bond head.

15. The bonding apparatus of claim 12 further comprising a valve connected to the inlet of the cooling-media channel.

* * * * *